(12) United States Patent
Fang et al.

(10) Patent No.: US 11,329,192 B2
(45) Date of Patent: May 10, 2022

(54) SEMICONDUCTOR STRUCTURE

(71) Applicant: PlayNitride Display Co., Ltd., Zhunan Township, Miaoli County (TW)

(72) Inventors: Hsin-Chiao Fang, Zhunan Township (TW); Shen-Jie Wang, Zhunan Township (TW); Yen-Lin Lai, Zhunan Township (TW)

(73) Assignee: PLAYNITRIDE DISPLAY CO., LTD., Zhunan Township, Miaoli County (TW)

( * ) Notice: Subject to any disclaimer, the term of this patent is extended or adjusted under 35 U.S.C. 154(b) by 147 days.

(21) Appl. No.: 16/868,883

(22) Filed: May 7, 2020

(65) Prior Publication Data
US 2021/0135051 A1    May 6, 2021

(30) Foreign Application Priority Data
Nov. 6, 2019  (TW) ................. 108140246

(51) Int. Cl.
*H01L 33/32* (2010.01)
*H01L 33/12* (2010.01)
*H01L 33/02* (2010.01)
*H01L 33/00* (2010.01)

(52) U.S. Cl.
CPC .......... *H01L 33/12* (2013.01); *H01L 33/0062* (2013.01); *H01L 33/0075* (2013.01); *H01L 33/02* (2013.01); *H01L 33/32* (2013.01)

(58) Field of Classification Search
CPC ..... H01L 33/32; H01L 33/12; H01L 33/0062; H01L 33/0075; H01L 33/02
See application file for complete search history.

(56) References Cited

U.S. PATENT DOCUMENTS

| 8,080,833 | B2 | 12/2011 | Grandusky et al. |
| 9,419,160 | B2* | 8/2016 | Hsuan ................ H01L 31/0312 |
| 9,443,728 | B2 | 9/2016 | Srinivasan et al. |
| 9,911,901 | B2* | 3/2018 | Lee .......................... H01L 33/62 |

(Continued)

FOREIGN PATENT DOCUMENTS

| CN | 103972344 A | 8/2014 |
| CN | 105140356 A | 12/2015 |

(Continued)

OTHER PUBLICATIONS

Chinese Office Action and Search Report, dated Jun. 3, 2020, for Chinese Application No. 201911074567.2.

(Continued)

Primary Examiner — Savitri Mulpuri
(74) Attorney, Agent, or Firm — Birch, Stewart, Kolasch & Birch, LLP

(57) ABSTRACT

The embodiment of the present disclosure provides a semiconductor structure. The semiconductor structure includes a substrate. The semiconductor structure also includes a first buffer layer disposed on the substrate. The semiconductor structure further includes a second buffer layer disposed on the first buffer layer. The semiconductor structure includes a semiconductor-based layer disposed on the second buffer layer. The second buffer layer includes aluminum, and the aluminum content of the second buffer layer gradually increases in the direction away from the substrate.

12 Claims, 7 Drawing Sheets

(56) References Cited

U.S. PATENT DOCUMENTS

| | | | | |
|---|---|---|---|---|
| 9,991,346 B2* | 6/2018 | Derluyn | .............. | H01L 21/0251 |
| 2013/0200495 A1* | 8/2013 | Keller | ............... | H01L 21/02381 |
| | | | | 257/615 |
| 2014/0091314 A1* | 4/2014 | Ishiguro | .............. | H01L 29/7787 |
| | | | | 257/76 |
| 2015/0348780 A1 | 12/2015 | Era et al. | | |

FOREIGN PATENT DOCUMENTS

| | | |
|---|---|---|
| CN | 105280770 B | 6/2018 |
| CN | 105720088 B | 8/2018 |
| TW | M298776 U | 10/2006 |
| TW | I655790 B | 4/2019 |
| TW | I670864 B | 9/2019 |

OTHER PUBLICATIONS

Taiwanese Office Acton and Search Report, dated Aug. 19, 2020, for Taiwanese Application No. 108140246.

* cited by examiner

SEMICONDUCTOR STRUCTURE

CROSS REFERENCE TO RELATED APPLICATIONS

This application claims the benefit of Taiwan Application No. 108140246, filed Nov. 6, 2019, the entirety of which is incorporated by reference herein.

BACKGROUND

Technical Field

Embodiments of the present disclosure relate to a semiconductor structure, and in particular they relate to a semiconductor structure that includes a buffer layer with aluminum content that varies gradually.

Description of the Related Art

In a semiconductor structure, there may a large lattice mismatch between the substrate and the buffer layer (e.g., aluminum gallium nitride), which may easily cause the epitaxial layer (e.g., gallium nitride) to have a high dislocation (TD) density when grown on the substrate, thereby affecting the performance of a subsequent device. For example, when the semiconductor structure is applied to a light-emitting device, the dislocation of the epitaxial layer may reduce the light-emitting efficiency of the light-emitting device.

Generally, silicon nitride ($SiN_x$) or silicon oxide ($SiO_2$) is used as a barrier layer to reduce the dislocation of the epitaxial layer. However, this method requires lateral growth of the epitaxial layer to a certain thickness in order to effectively reduce the dislocation of the epitaxial layer.

Therefore, there is a need for a semiconductor structure to more effectively reduce the dislocation of the epitaxial layer.

SUMMARY

In the semiconductor according to the embodiments of the present disclosure, a buffer layer (second buffer layer) including aluminum may be provided between the semiconductor-based layer and another buffer layer (first buffer layer), and the aluminum content gradually increases in the direction away from the substrate. Thus, most of the dislocation is blocked under the (second) buffer layer that includes aluminum. Moreover, the stress in the semiconductor structure may also be uniform.

Some embodiments of the present disclosure include a semiconductor structure. The semiconductor structure includes a substrate. The semiconductor structure also includes a first buffer layer disposed on the substrate. The semiconductor structure further includes a second buffer layer disposed on the first buffer layer. The semiconductor structure includes a semiconductor-based layer disposed on the second buffer layer. The second buffer layer includes aluminum, and the aluminum content of the second buffer layer gradually increases in the direction away from the substrate.

BRIEF DESCRIPTION OF THE DRAWINGS

Aspects of the embodiments of the present disclosure can be understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
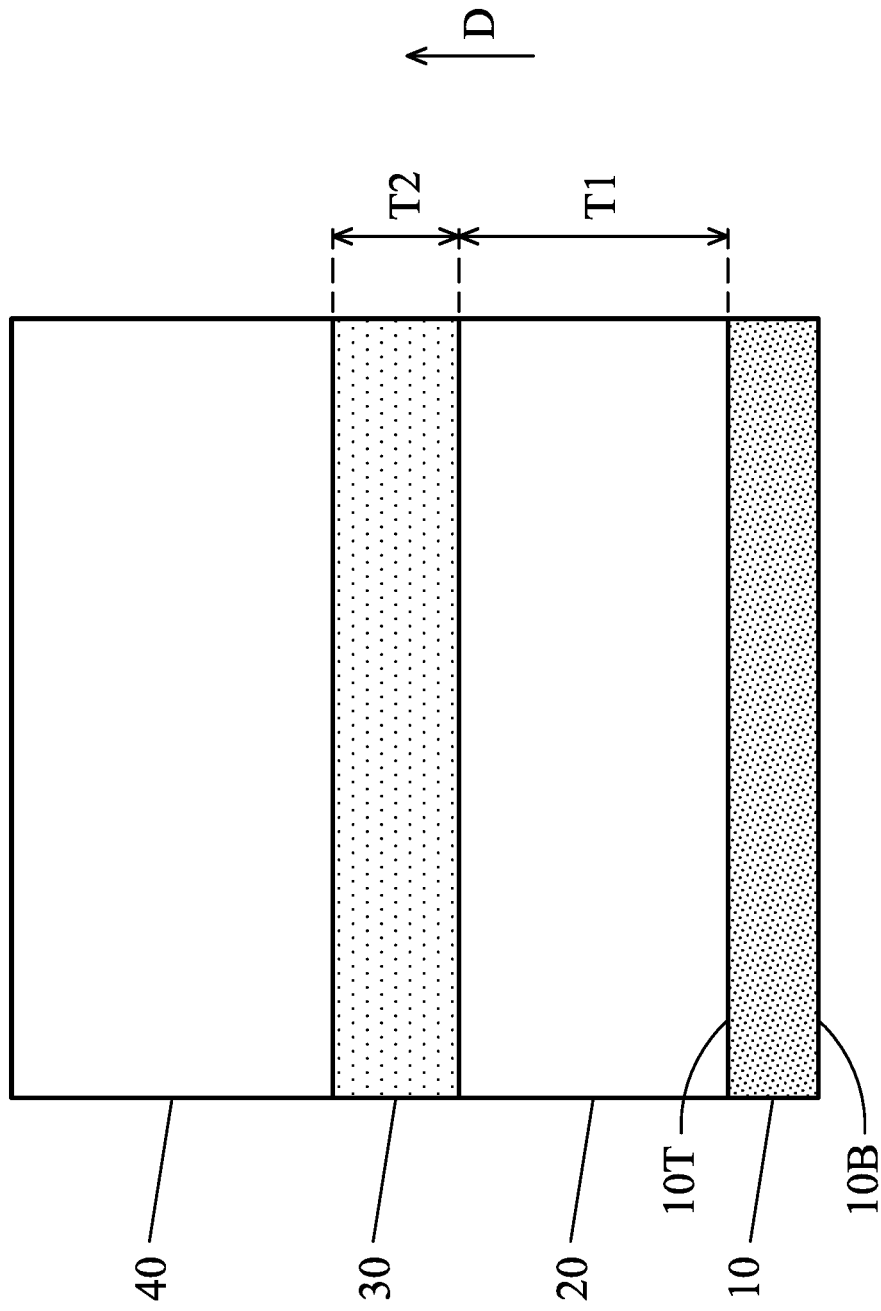
FIG. 1 is a partial cross-sectional view illustrating a semiconductor structure according to one embodiment of the present disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, a first feature is formed on a second feature in the description that follows may include embodiments in which the first feature and second feature are formed in direct contact, and may also include embodiments in which additional features may be formed between the first feature and second feature, so that the first feature and second feature may not be in direct contact. In addition, the present disclosure may repeat reference numerals and/or letters in the various examples. This repetition is for the purpose of simplicity and clarity and does not in itself dictate a relationship between the various embodiments and/or configurations discussed.

It should be understood that additional steps may be implemented before, during, or after the illustrated methods, and some steps might be replaced or omitted in other embodiments of the illustrated methods.

Furthermore, spatially relative terms, such as "beneath," "below," "lower," "on," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, the terms "about," "approximately" and "substantially" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +1-0.5% of the stated value. The stated value of the present disclosure is an approximate value. That is, when there is no specific description of the terms "about," "approximately" and "substantially", the stated value includes the meaning of "about," "approximately" or "substantially".

Unless otherwise defined, all terms (including technical and scientific terms) used herein have the same meaning as commonly understood by one of ordinary skill in the art to which this disclosure belongs. It should be understood that terms such as those defined in commonly used dictionaries should be interpreted as having a meaning that is consistent with their meaning in the context of the relevant art and will not be interpreted in an idealized or overly formal sense unless expressly so defined in the embodiments of the present disclosure.

The present disclosure may repeat reference numerals and/or letters in following embodiments. This repetition is for the purpose of simplicity and clarity and does not in itself dictate a relationship between the various embodiments and/or configurations discussed.

FIG. 1 is a partial cross-sectional view illustrating a semiconductor structure 100 according to one embodiment of the present disclosure. It should be noted that some components may be omitted in FIG. 1 in order to more clearly illustrate the features of the embodiments of the present disclosure.

Referring to FIG. 1, the semiconductor substrate 100 according to the embodiments of the present disclosure includes a substrate 10. The semiconductor structure 100 also includes a first buffer layer 20, and the first buffer layer 20 may be disposed on the substrate 10. The semiconductor structure 100 further includes a second buffer layer 30, and the second buffer layer 30 may be disposed on the first buffer layer 20. The semiconductor structure includes a semiconductor-based layer 40, and the semiconductor-based layer 40 may be disposed on the second buffer layer 30.

In the embodiments of the present disclosure, the second buffer layer 30 may include aluminum, and the aluminum content of the second buffer layer 30 gradually increases in the direction (e.g., direction D shown in FIG. 1) away from the substrate 10. In particular, the direction D shown in FIG. 1 may be an epitaxial growth direction of the second buffer layer 30, which is, for example, perpendicular to the top surface 10T or the bottom surface 10B of the substrate 10. That is, the direction D may be substantially parallel to the normal direction of the top surface 10T of the substrate 10, but the present disclosure is not limited thereto. In some embodiments, since the top surface 10T of the substrate 10 may be a rough surface or a non-planar surface, the direction (direction D) away from the substrate 10 may not be parallel to the normal direction of the top surface 10T of the substrate 10.

In some embodiments, the method of manufacturing the semiconductor structure 100 may include the following steps. First, a substrate 10 is provided. In some embodiments, the substrate 10 may be a semiconductor substrate. For example, the material of the substrate 10 may include silicon, silicon germanium, gallium nitride, gallium arsenide, any other applicable semiconductor material, or a combination thereof. In some embodiments, the substrate 10 may be a semiconductor-on-insulator substrate, such as a silicon-on-insulator (SOI) substrate. In some embodiments, the substrate 10 may be a glass substrate, an insulation substrate or a ceramic substrate. For example, the material of the substrate 10 may include silicon carbide (SiC), aluminum nitride (AlN), glass, or sapphire, but the present disclosure is not limited thereto.

Then, a first buffer layer 20 is formed on the substrate 10. In some embodiments, the material of the first buffer layer 20 may include aluminum nitride (AlN), gallium nitride (GaN), aluminum gallium nitride (AlGaN), any other applicable material, or a combination thereof, but the present disclosure is not limited thereto. The first buffer layer 20 may be a single-layer or multi-layer structure. In some embodiments, the first buffer layer 20 may be formed by an epitaxial growth process, such as metal organic chemical vapor deposition (MOCVD), hydride vapor phase epitaxy (HVPE), molecular beam epitaxy (MBE), any other applicable method, or a combination thereof, but the present disclosure is not limited thereto.

In the embodiments of the present disclosure, the first buffer layer 20 includes aluminum, and the aluminum content of the first buffer layer 20 gradually decreases in the direction (e.g., direction D shown in FIG. 1) away from the substrate 10. In particular, the material of the first buffer layer 20 may include $Al_xGa_{1-x}N$, where $0 \leq x \leq 1$. Moreover, the aluminum content of the first buffer layer 20 varies continuously in the direction away from the substrate 10. That is, the value of x may continuously vary from high to low, for example from 100% to 20%. Alternatively, the aluminum content of the first buffer layer 20 varies stepwise in the direction away from the substrate 10. For example, the first buffer layer 20 may be a multi-layer structure. That is, the first buffer layer 20 may include a plurality of sub-layers, the aluminum content of each of the sub-layers is constant, and the aluminum content of the sub-layers are different from each other. The further away the layer is from the substrate, the lower its aluminum content. That is, the value of x may vary stepwise from high to low, for example from 100%, 70%, 40% to 20%.

Then, a second buffer layer 30 is formed on the first buffer layer 20. In some embodiments, the material of the second buffer layer 30 may be similar to the material of the first buffer layer 20. That is, the material of the second buffer layer 30 may include aluminum nitride (AlN), gallium nitride (GaN), aluminum gallium nitride (AlGaN), any other applicable material, or a combination thereof, but the present disclosure is not limited thereto. The second buffer layer 30 may be a single-layer or multi-layer structure. In some embodiments, the second buffer layer 30 may be formed by an epitaxial growth process, but the present disclosure is not limited thereto.

In the embodiments of the present disclosure, the second buffer layer 30 includes aluminum, and the aluminum content of the second buffer layer 30 gradually increases in the direction (e.g., direction D shown in FIG. 1) away from the substrate 10. In particular, the material of the second buffer layer 30 may include $Al_xGa_{1-x}N$, where $0 \leq x \leq 1$. In some embodiments, $0 < x \leq 1$, which means that the second buffer layer 30 includes aluminum in every position, so that most of the dislocation may be blocked under the second buffer layer 30 more effectively. Moreover, the aluminum content of the second buffer layer 30 varies continuously in the direction away from the substrate 10. That is, the value of x may continuously vary from low to high, for example from 20% to 100%. Alternatively, the aluminum content of the second buffer layer 30 varies stepwise in the direction away from the substrate 10. For example, the second buffer layer 30 may be a multi-layer structure. That is, the second buffer layer 30 may include a plurality of sub-layers, the aluminum content of each of the sub-layers is constant, and the aluminum content of the sub-layers are different from each other. The further away the layer is from the substrate, the higher its aluminum content. That is, the value of x may vary stepwise from low to high, for example from 20%, 40%, 70% to 100%.

In some embodiments, the minimum aluminum content in the first buffer layer 20 is substantially equal to the minimum aluminum content in the second buffer layer 30. For example, the aluminum content in the first buffer layer 20 and the aluminum content in the second buffer layer 30 continuously vary at the boundary between the first buffer layer 20 and the second buffer layer 30, but the present disclosure is not limited thereto. Alternatively, the first buffer layer 20 includes a plurality of sub-layers, and the second buffer layer 30 also includes a plurality of sub-layers, and The sub-layer of the first buffer layer 20 closest to the second buffer layer 30 and the sub-layer of the second buffer layer 30 closest to the first buffer layer 20 have substantially the same aluminum content, but the present disclosure is not limited thereto.

In some embodiments, the first buffer layer 20 and the second buffer layer 30 may be undoped, so that the undoped first buffer layer 20 and the undoped second buffer layer 30 may provide better buffering, but the present disclosure is not limited thereto.

In some embodiments, the thickness T2 of the second buffer layer 30 is smaller than the thickness T1 of the first buffer layer 20. For example, the ratio of the thickness T2 of the second buffer layer 30 to the thickness T1 of the first buffer layer 20 is larger than or equal to 0.01, and smaller than 1, but the present disclosure is not limited thereto. In some embodiments, the ratio of the thickness T2 of the second buffer layer 30 to the thickness T1 of the first buffer layer 20 is larger than or equal to 0.01, and smaller than 0.2. If the thickness T2 of the second buffer layer 30 is too thick, then the dislocation (TD) may increase.

In the embodiments of the present disclosure, the dislocation density of the first buffer layer 20 is greater than the dislocation density of the second buffer layer 30. There may a large lattice mismatch between the substrate 10 and the first buffer layer 20, which may cause a high dislocation density. However, since the second buffer layer 30 is formed on the first buffer layer 20 and the aluminum content of the second buffer layer 30 gradually increases in the direction away from the substrate 10, most of the dislocation may be blocked under the second buffer layer 30, thereby improving the quality of the semiconductor structure 100. In some embodiments, when applied to a substrate 10 including a silicon material, there may be a larger lattice mismatch than that applied to a general sapphire substrate. The embodiments of the present disclosure may effectively block most of the dislocation caused by the substrate 10 and the first buffer layer 20.

Moreover, the thickness T2 of the second buffer layer 30 is smaller than the thickness T1 of the first buffer layer 20. It is not necessary to form a very thick second buffer layer 30, and the lateral growth of the semiconductor-based layer 40 (including the epitaxial layer) to a certain thickness is not required, which may effectively exclude most of the dislocation and may reduce the manufacturing cost of the semiconductor structure 100. Furthermore, the structure also makes the stress in the semiconductor structure 100 uniform.

Then, a semiconductor-based layer 40 is formed on the second buffer layer 30. In some embodiments, the semiconductor-based layer 40 may be formed by an epitaxial growth process, and the material of the semiconductor-based layer 40 may include gallium nitride, aluminum gallium nitride, indium gallium nitride, aluminum indium gallium nitride, any other applicable material, or a combination thereof, but the present disclosure is not limited thereto. Similarly, the semiconductor-based layer 40 may be a single-layer or multi-layer structure.

In some embodiments, the semiconductor-based layer 40 includes an epitaxial layer, such as gallium nitride (GaN). In the embodiments of the present disclosure, since the second buffer layer 30 is disposed between the semiconductor-based layer 40 and the first buffer layer 20 and the aluminum content of the second buffer layer 30 gradually increases in the direction away from the substrate 10, most of the dislocation may be blocked below the second buffer layer 30, which may effectively improve the quality of the epitaxial layer of the semiconductor-based layer 40, thereby improving the quality of the semiconductor structure 100.

FIG. 2, FIG. 3, FIG. 4, FIG. 5 FIG. 6, and FIG. 7 are partial cross-sectional views respectively illustrating a semiconductor structure 102, a semiconductor structure 103, a semiconductor structure 104, a semiconductor structure 105, a semiconductor structure 106, and a semiconductor structure 107 according to other embodiments of the present disclosure. It should be noted that some components may be omitted in FIG. 2 to FIG. 7 in order to more clearly illustrate the features of the embodiments of the present disclosure.

Figure 2:
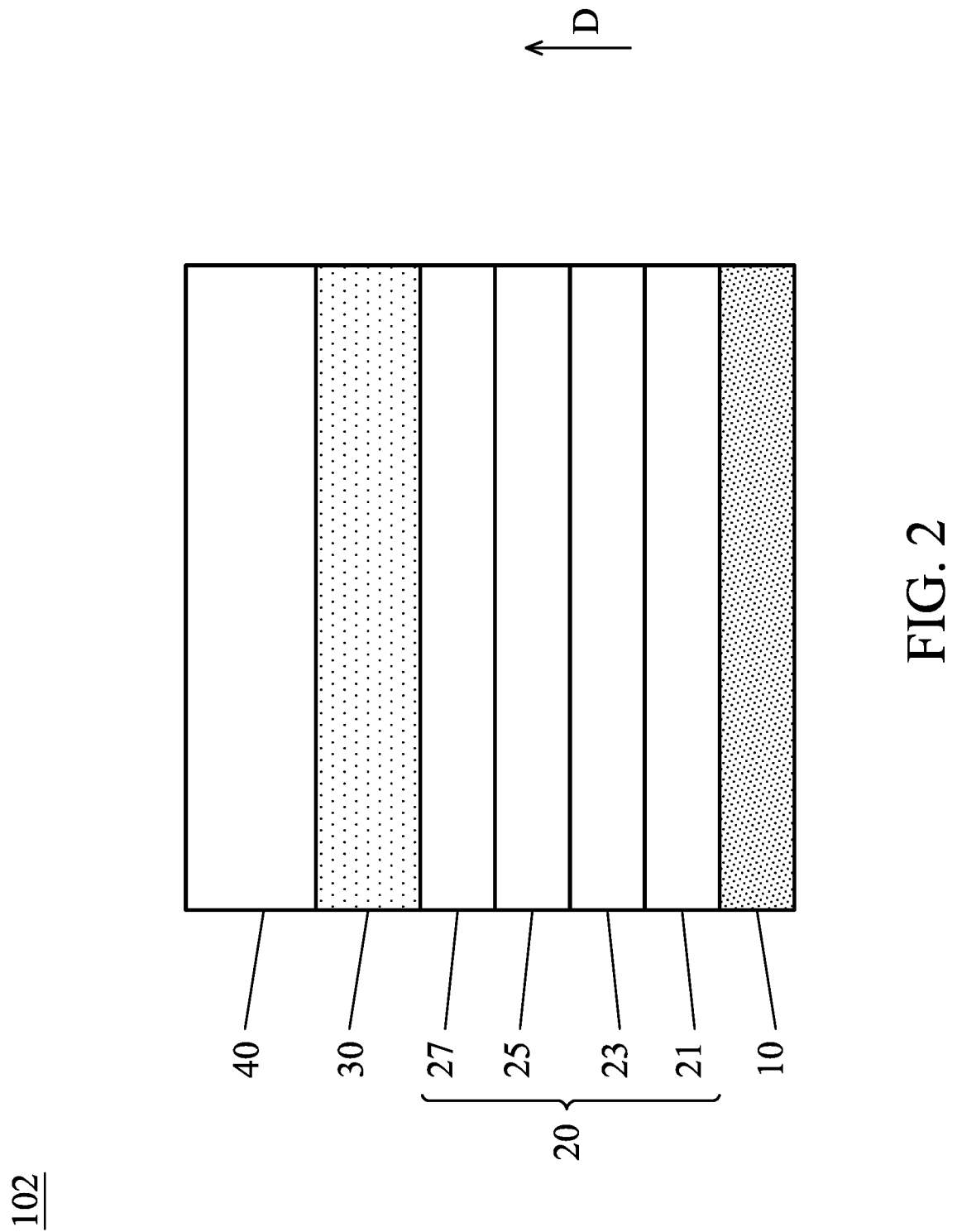
FIG. 2 is a partial cross-sectional view illustrating a semiconductor structure according to another embodiment of the present disclosure.

Referring to FIG. 2, the semiconductor structure 102 has a structure that is similar to the semiconductor structure 100 shown in FIG. 1. The semiconductor substrate 102 includes a substrate 10. The semiconductor structure 102 also includes a first buffer layer 20, and the first buffer layer 20 may be disposed on the substrate 10. The semiconductor structure 102 further includes a second buffer layer 30, and the second buffer layer 30 may be disposed on the first buffer layer 20. The aluminum content of the second buffer layer 30 gradually increases in the direction (e.g., direction D shown in FIG. 2) away from the substrate 10. The semiconductor structure includes a semiconductor-based layer 40, and the semiconductor-based layer 40 may be disposed on the second buffer layer 30.

The difference from the semiconductor structure 100 shown in FIG. 1 is that the aluminum content of the first buffer layer 20 of the semiconductor structure 102 shown in FIG. 2 varies stepwise (gradually decreases) in the direction (e.g., direction D shown in FIG. 2) away from the substrate 10. In particular, the first buffer layer 20 is a multi-layer structure, which includes a first sub-layer 21, a first sub-layer 23, a first sub-layer 25, and a first sub-layer 27. The first sub-layer 21, the first sub-layer 23, the first sub-layer 25, and the first sub-layer 27 may be sequentially disposed on the substrate 10, but the present disclosure is not limited thereto.

In some embodiments, the first buffer layer 20 may be represented as $Al_xGa_{1-x}N$, where $0 \leq x \leq 1$. The aluminum content of the first buffer layer 20 varies stepwise in the direction (e.g., direction D shown in FIG. 2) away from the substrate 10. That is, the value of x may vary stepwise from high to low, for example from 100%, 80%, 50% to 20%. In particular, the material of the first sub-layer 21 includes aluminum nitride (AlN); the material of the first sub-layer 23 includes aluminum gallium nitride, and its structure may be represented as $Al_{x1}Ga_{1-x1}N$, where x1=80%±10%; the material of the first sub-layer 25 includes aluminum gallium nitride, and its structure may be represented as $Al_{x2}Ga_{1-x2}N$, where x2=50%±10%; the material of the first sub-layer 27 includes aluminum gallium nitride, and its structure may be represented as $Al_{x3}Ga_{1-x3}N$, where x3=20%±10%, but the present disclosure is not limited thereto. It is particularly noted that the value of x of the first sub-layer near the buffer layer of the substrate 10 (i.e., the first sub-layer 21) or the value of x of the interface is preferably 100%, which may effectively slow down the large lattice mismatch (that cause a high dislocation density) with the substrate 10, or prevent gallium from reacting with the substrate 10.

In the embodiment shown in FIG. 2, the second buffer layer 30 may include aluminum, and the aluminum content of the second buffer layer 30 gradually increases in the direction (e.g., direction D shown in FIG. 2) away from the substrate 10. In particular, the aluminum content of the second buffer layer 30 varies continuously (gradually increases) in the direction (e.g., direction D shown in FIG. 2) away from the substrate 10. For example, the second buffer layer 30 may be a single-layer structure. The material of the second buffer layer 30 may include aluminum gallium nitride, and its structure may be represented as $Al_yGa_{1-y}N$, where y=(20%±10% to 90%±10%), but the present disclosure is not limited thereto.

Figure 3:
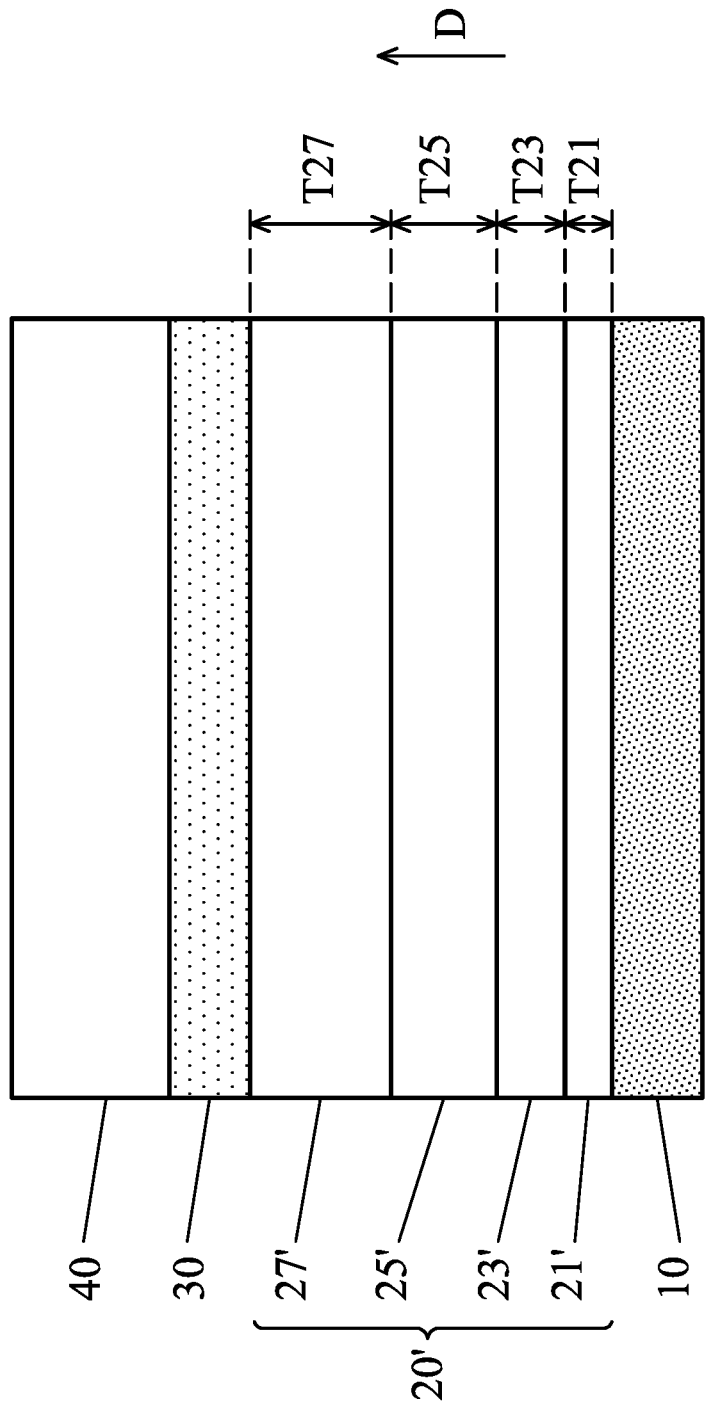
FIG. 3 is a partial cross-sectional view illustrating a semiconductor structure according to another embodiment of the present disclosure.

Referring to FIG. 3, the semiconductor structure 103 has a structure that is similar to the semiconductor structure 102 shown in FIG. 2. The difference from the semiconductor structure 102 shown in FIG. 2 is that the thickness of the first sub-layers of the first buffer layer 20' of the semiconductor structure 103 shown in FIG. 3 are different. In particular, the thickness of at least some of the first sub-layers of the first buffer layer 20' gradually vary in the direction D away from the substrate 10, for example, all of them gradually increase, which may have better epitaxial quality. For example, the first sub-layer 21' has a thickness T21, the first sub-layer 23' has a thickness T23, the first sub-layer 25' has a thickness T25, and the first sub-layer 27' has a thickness T27. In this embodiment, the thickness T21 of the first sub-layer 21' is smaller than the thickness T23 of the first sub-layer 23', the thickness T23 of the first sub-layer 23' is smaller than the thickness T25 of the first sub-layer 25', and the thickness T25 of the first sub-layer 25' is smaller than the thickness T27 of the first sub-layer 27', but the present disclosure is not limited thereto.

In another embodiment, it is also possible that only some of the first sub-layers of the first buffer layer 20' gradually vary in the direction D away from the substrate 10. For example, the thickness T23 of the first sub-layer 23' is smaller than the thickness T25 of the first sub-layer 25', the thickness T25 of the first sub-layer 25' is smaller than the thickness T27 of the first sub-layer 27', but the thickness T21 of the first sub-layer 21' (e.g., AlN) is larger than or equal to the thickness T23 of the first sub-layer 23'.

Figure 4:
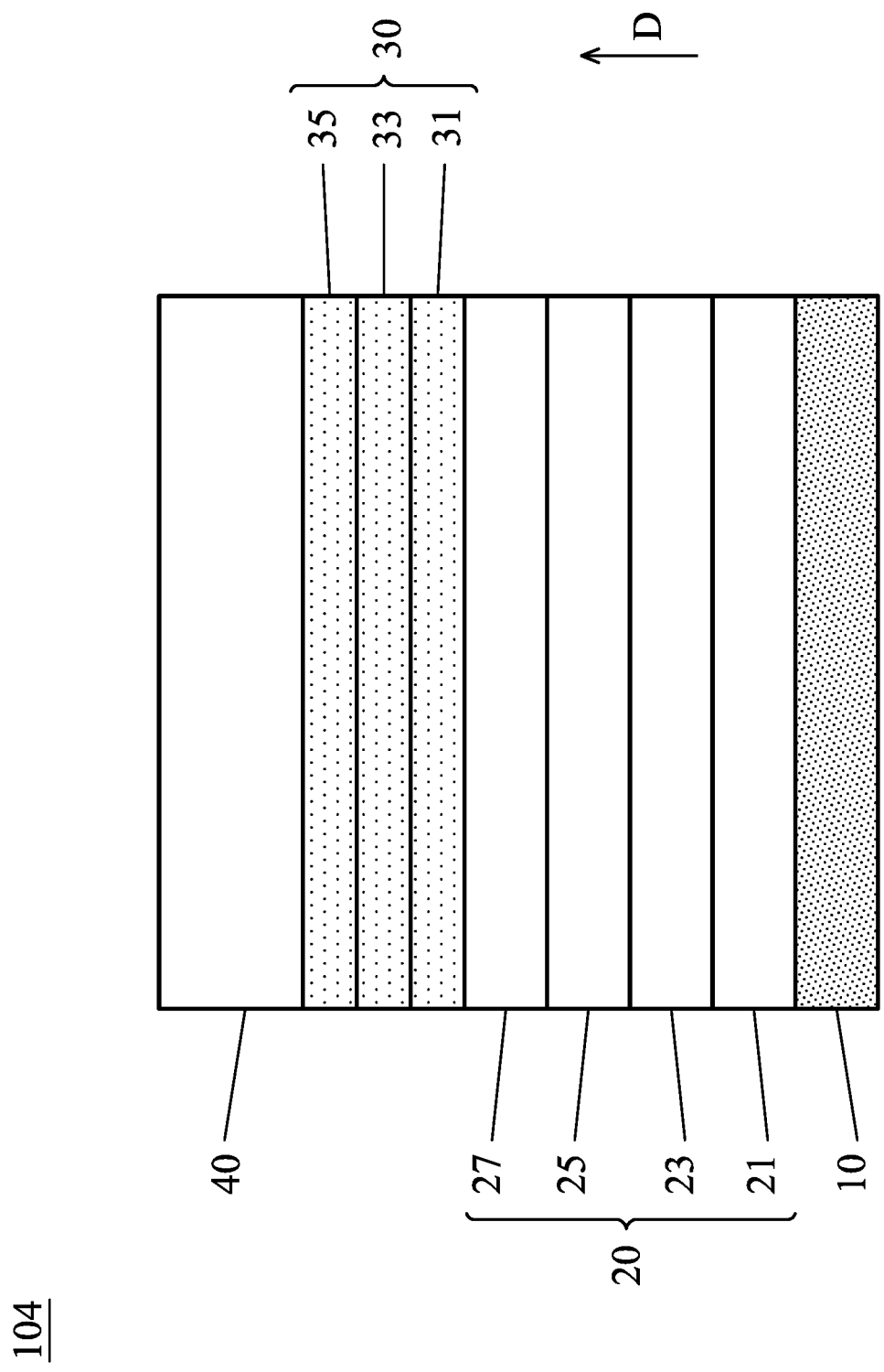
FIG. 4 is a partial cross-sectional view illustrating a semiconductor structure according to another embodiment of the present disclosure.

Referring to FIG. 4, the semiconductor structure 104 has a structure that is similar to the semiconductor structure 102 shown in FIG. 2. The semiconductor structure 104 includes a substrate 10. The semiconductor structure 104 also includes a first buffer layer 20, and the first buffer layer 20 may be disposed on the substrate 10. The semiconductor structure 104 further includes a second buffer layer 30, and the second buffer layer 30 may be disposed on the first buffer layer 20. The aluminum content of the second buffer layer 30 gradually increases in the direction (e.g., direction D shown in FIG. 4) away from the substrate 10. The semiconductor structure includes a semiconductor-based layer 40, and the semiconductor-based layer 40 may be disposed on the second buffer layer 30.

The difference from the semiconductor structure 102 shown in FIG. 2 is that the aluminum content of the second buffer layer 30 of the semiconductor structure 104 shown in FIG. 4 varies stepwise (gradually increases) in the direction (e.g., direction D shown in FIG. 4) away from the substrate 10. In particular, the second buffer layer 30 is a multi-layer structure, which includes a second sub-layer 31, a second sub-layer 33, and a second sub-layer 35. The second sub-layer 31, the second sub-layer 33, and the second sub-layer 35 may be sequentially disposed on the first buffer layer 20, but the present disclosure is not limited thereto.

In some embodiments, the second buffer layer 30 may be represented as $Al_yGa_{1-y}N$, where 0≤y≤1. The aluminum content of the second buffer layer 30 varies stepwise in the direction (e.g., direction D shown in FIG. 4) away from the substrate 10. That is, the value of y may vary stepwise from low to high, for example from 20%, 50% to 80%. In particular, the material of the second sub-layer 31 includes aluminum gallium nitride, and its structure may be represented as $Al_{y1}Ga_{1-y1}N$, where y1=20%±10%; the material of the second sub-layer 33 includes aluminum gallium nitride, and its structure may be represented as $Al_{y2}Ga_{1-y2}N$, where y2=50%±10%; the material of the second sub-layer 35 includes aluminum gallium nitride, and its structure may be represented as $Al_{y3}Ga_{1-y3}N$, where y3=80%±10%, but the present disclosure is not limited thereto.

In the embodiment shown in FIG. 4, the aluminum content of the first buffer layer 20 also varies stepwise (gradually decreases) in the direction (e.g., direction D shown in FIG. 4) away from the substrate 10. For example, the aluminum content of the first sub-layer 27 of the first buffer layer 20 is substantially the same as the aluminum content of the second sub-layer 31 of the second buffer layer 30, but the present disclosure is not limited thereto. In some embodiments, the aluminum content of the first buffer layer 20 may vary continuously (gradually decreases) in the direction (e.g., direction D shown in FIG. 4) away from the substrate 10.

Figure 5:
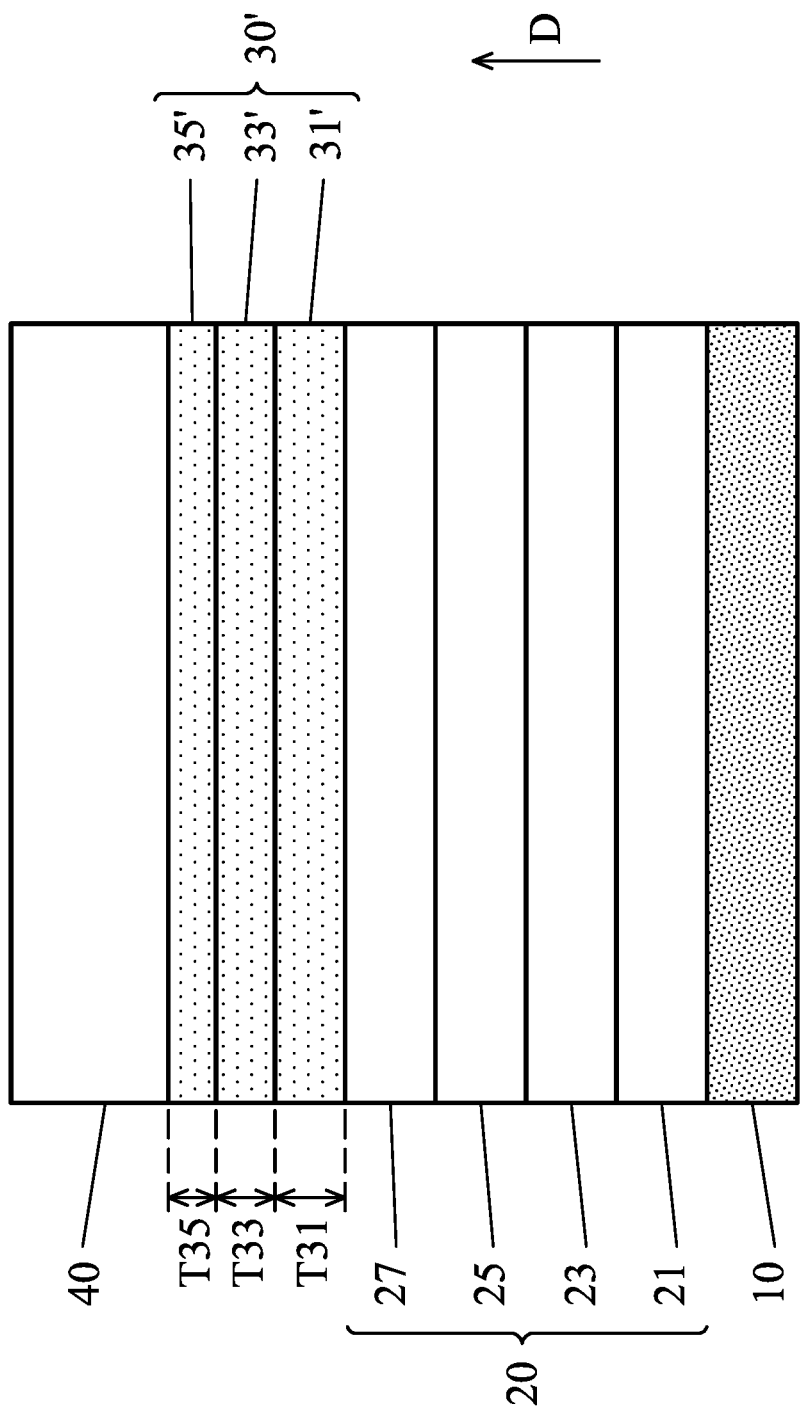
FIG. 5 is a partial cross-sectional view illustrating a semiconductor structure according to another embodiment of the present disclosure.

Referring to FIG. 5, the semiconductor structure 105 has a structure that is similar to the semiconductor structure 104 shown in FIG. 4. The difference from the semiconductor structure 104 shown in FIG. 4 is that the thickness of the second sub-layers of the second buffer layer 30' of the semiconductor structure 105 shown in FIG. 5 are different. In particular, the thickness of the second sub-layers of the second buffer layer 30' gradually vary in the direction D away from the substrate 10, for example, all of them gradually decrease, which may have better epitaxial quality. For example, the second sub-layer 31' has a thickness T31, the second sub-layer 33' has a thickness T33, and the second sub-layer 35' has a thickness T35. In this embodiment, the thickness T31 of the second sub-layer 31' is larger than the thickness T33 of the second sub-layer 33', and the thickness T33 of the second sub-layer 33' is larger than the thickness T35 of the second sub-layer 35', but the present disclosure is not limited thereto.

Figure 6:
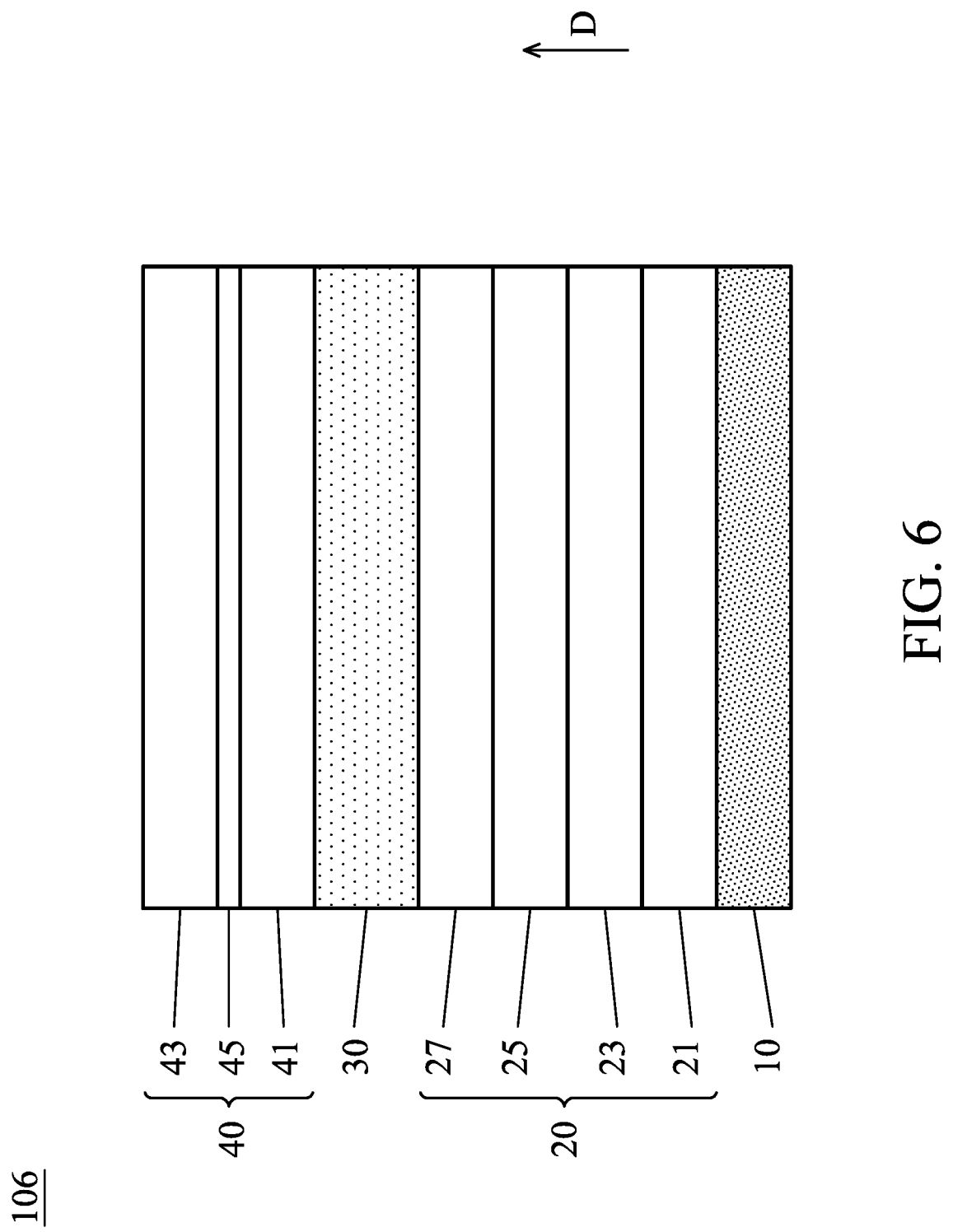
FIG. 6 is a partial cross-sectional view illustrating a semiconductor structure according to another embodiment of the present disclosure.

Referring to FIG. 6, the semiconductor structure 106 has a structure that is similar to the semiconductor structure 102 shown in FIG. 2. The semiconductor substrate 106 includes a substrate 10. The semiconductor structure 106 also includes a first buffer layer 20, and the first buffer layer 20 may be disposed on the substrate 10. The semiconductor structure 106 further includes a second buffer layer 30, and the second buffer layer 30 may be disposed on the first buffer layer 20. The aluminum content of the second buffer layer 30 gradually increases in the direction (e.g., direction D shown in FIG. 6) away from the substrate 10. The semiconductor structure includes a semiconductor-based layer 40, and the semiconductor-based layer 40 may be disposed on the second buffer layer 30.

The difference from the semiconductor structure 102 shown in FIG. 2 is that the semiconductor-based layer 40 of the semiconductor structure 106 shown in FIG. 6 may include a first semiconductor layer 41, a second semiconductor layer 43, and a light-emitting layer 45. The first semiconductor layer 41, the second semiconductor layer 43, and the light-emitting layer 45 may be formed by an epitaxial growth process, respectively. As shown in FIG. 6, the first semiconductor layer 41 may be disposed on the second buffer layer 30, the second semiconductor layer 43 may be disposed on the first semiconductor layer 41, and the light-emitting layer 45 may be disposed between the first semiconductor layer 41 and the second semiconductor layer 43.

In some embodiments, the conductivity type of the first semiconductor layer 41 is opposite to the conductivity type of the second semiconductor layer 43. That is, the dopants of the first semiconductor layer 41 and the dopants of the second semiconductor layer 43 have different conductivity types. For example, the first semiconductor layer 41 may include N-type GaN-based semiconductor (e.g., GaN, AlGaN or AlInGaN), and the second semiconductor layer 43 may include P-type GaN-based semiconductor (e.g., GaN, AlGaN or AlInGaN), but the present disclosure is not limited thereto. The material and the conductivity type of the first semiconductor layer 41 and the material and the conductivity type of the second semiconductor layer 43 may also be different from the foregoing, and may be adjusted according to actual needs. It should be particularly noted that the first semiconductor layer 41 may also include an undoped semiconductor layer to provide better buffering and reduce stress.

It should be noted that although FIG. 6 illustrates that the aluminum content of the first buffer layer 20 varies stepwise (decreases gradually) in the direction (e.g., direction D shown in FIG. 6) away from the substrate 10, and the aluminum content of the second buffer layer 30 varied continuously (increases gradually) in the direction (e.g., direction D shown in FIG. 6) away from the substrate 10, the present disclosure is not limited thereto. In other embodiments, the aluminum content of the first buffer layer 20 may also vary continuously (decreases gradually) in the direction (e.g., direction D shown in FIG. 6) away from the substrate 10, or the aluminum content of the second buffer layer 30 may also vary stepwise (increases gradually) in the direction (e.g., direction D shown in FIG. 6) away from the substrate 10.

Figure 7:
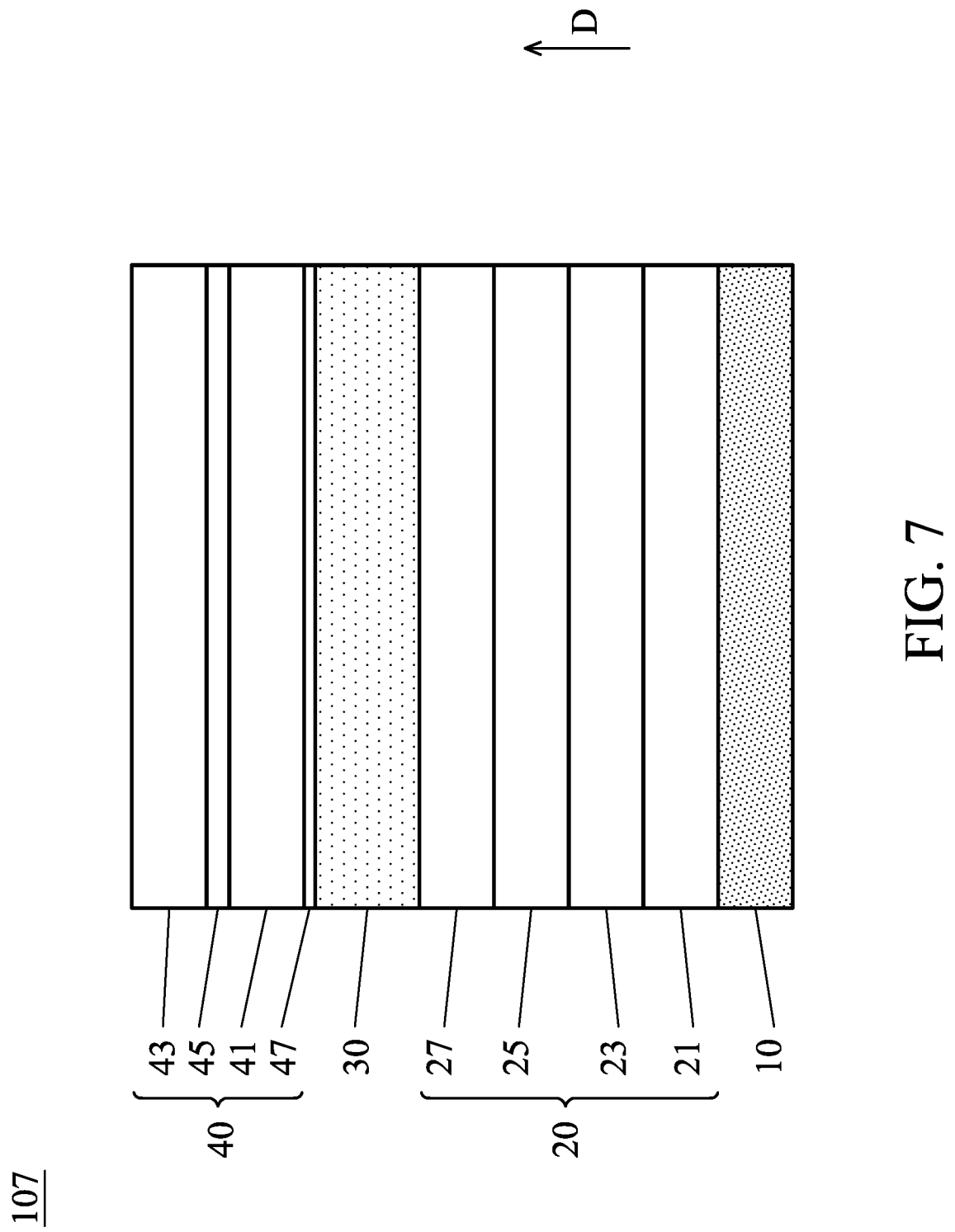
FIG. 7 is a partial cross-sectional view illustrating a semiconductor structure according to another embodiment of the present disclosure.

Referring to FIG. 7, the semiconductor structure 107 has a structure that is similar to the semiconductor structure 106 shown in FIG. 6. The difference from the semiconductor structure 106 shown in FIG. 6 is that the semiconductor-based layer 40' shown in FIG. 7 may further include an undoped layer 47. As shown in FIG. 7, the undoped layer 47 may be disposed between the first semiconductor layer 41 and the second buffer layer 30, but the present disclosure is not limited thereto.

In this embodiments, the undoped layer 47 may provide better buffering to block most of the dislocation, so that the subsequent first semiconductor layer 41, light-emitting layer 45, and second semiconductor layer 43 grow (or be formed) better. In some embodiments, the undoped layer 47 may be an undoped GaN, but the present disclosure is not limited thereto.

In summary, in the semiconductor structure according to the embodiments of the present disclosure, since the second buffer layer is formed between the semiconductor-based layer and the first buffer layer and the aluminum content of the second buffer layer gradually increases in the direction away from the substrate (continuously or stepwise), most of the dislocation may be blocked under the second buffer layer, which may effectively improve the quality of the epitaxial layer of the semiconductor-based layer, thereby improving the quality of the semiconductor structure.

Moreover, the lateral growth of the semiconductor-based layer (including the epitaxial layer) to a certain thickness is not required for the semiconductor structure according to the embodiments of the present disclosure, which may effectively exclude most of the dislocation and may reduce the manufacturing cost of the semiconductor structure. Furthermore, the structure also makes the stress in the semiconductor structure uniform.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. Therefore, the scope of protection should be determined through the claims. In addition, although some embodiments of the present disclosure are disclosed above, they are not intended to limit the scope of the present disclosure.

Reference throughout this specification to features, advantages, or similar language does not imply that all of the features and advantages that may be realized with the present disclosure should be or are in any single embodiment of the disclosure. Rather, language referring to the features and advantages is understood to mean that a specific feature, advantage, or characteristic described in connection with an embodiment is included in at least one embodiment of the present disclosure. Thus, discussions of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the relevant art will recognize, in light of the description herein, that the disclosure can be practiced without one or more of the specific features or advantages of a particular embodiment. In other instances, additional features and advantages may be recognized in certain embodiments that may not be present in all embodiments of the disclosure.

What is claimed is:

1. A semiconductor structure, comprising:
a substrate;
a first buffer layer disposed on the substrate;
a second buffer layer disposed on the first buffer layer;
a semiconductor-based layer disposed on the second buffer layer;
wherein the first buffer layer comprises aluminum, an aluminum content of the first buffer layer gradually decreases in a direction away from the substrate, the second buffer layer comprises aluminum, and an aluminum content of the second buffer layer gradually increases in the direction away from the substrate, wherein the first buffer layer comprises a plurality of first sub-layers, the aluminum content of each of the first sub-layers is constant, and the aluminum content of the first sub-layers are different from each other and gradually decrease in the direction away from the substrate, wherein the second buffer layer comprises a plurality of second sub-layers, the aluminum content of each of the second sub-layers is constant, and the aluminum content of the second sub-layers are different from each other, and wherein the semiconductor-based layer comprises: a first semiconductor layer disposed on the second buffer layer; a second semiconductor layer disposed on the first semiconductor layer; and a light-emitting layer disposed between the first semiconductor layer and the second semiconductor layer.

2. The semiconductor structure according to claim 1, wherein the aluminum content of the second buffer layer varies continuously in the direction away from the substrate.

3. The semiconductor structure according to claim 1, wherein the aluminum content of the second buffer layer varies stepwise in the direction away from the substrate.

4. The semiconductor structure according to claim 1, wherein thickness of the second sub-layers gradually decreases in the direction away from the substrate.

5. The semiconductor structure according to claim 1, wherein a thickness of the second buffer layer is smaller than a thickness of the first buffer layer.

6. The semiconductor structure according to claim 5, wherein a ratio of the thickness of the second buffer layer to the thickness of the first buffer layer is larger than or equal to 0.01, and smaller than 1.

7. The semiconductor structure according to claim 1, wherein the first buffer layer and the second buffer layer comprises $Al_xGa_{1-x}N$, where $0 \leq x \leq 1$.

8. The semiconductor structure according to claim 1, wherein a minimum aluminum content in the first buffer layer is equal to a minimum aluminum content in the second buffer layer.

9. The semiconductor structure according to claim 1, wherein thickness of the first sub-layers gradually increases in the direction away from the substrate.

10. The semiconductor structure according to claim 1, wherein a conductivity type of the first semiconductor layer is opposite to a conductivity type of the second semiconductor layer.

11. The semiconductor structure according to claim 1, wherein the semiconductor-based layer further comprising:
    an undoped layer disposed between the first semiconductor layer and the second buffer layer.

12. The semiconductor structure according to claim 1, wherein the first buffer layer and the second buffer layer are undoped.

* * * * *